(12) United States Patent
Itoh

(10) Patent No.: US 6,452,222 B1
(45) Date of Patent: Sep. 17, 2002

(54) MIS TYPE SEMICONDUCTOR DEVICE AND METHOD FOR MANUFACTURING THE SAME

(75) Inventor: Yukio Itoh, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/458,510

(22) Filed: Dec. 13, 1999

(30) Foreign Application Priority Data

Dec. 11, 1998 (JP) .......................................... 10-353565

(51) Int. Cl.⁷ .............................................. H01L 29/76
(52) U.S. Cl. ...................... 257/288; 257/288; 257/327; 257/328; 257/329; 257/335; 257/339
(58) Field of Search ................ 257/288, 327, 257/328, 329, 335, 339

(56) References Cited

U.S. PATENT DOCUMENTS

| 5,825,065 A | * 10/1998 | Corai et al. .................. 257/328 |
| 6,160,288 A | * 12/2000 | Yamada ....................... 257/330 |
| 6,180,981 B1 | * 1/2001 | Kinzer et al. ................ 257/339 |
| 6,194,761 B1 | * 2/2001 | Chiozzi et al. ............. 257/328 |

FOREIGN PATENT DOCUMENTS

| JP | 62-189759 | 8/1987 |
| JP | 63-289871 | 11/1988 |
| JP | 1-140773 | 6/1989 |
| JP | 6-97448 | 4/1994 |
| JP | 7-66392 | 3/1995 |
| JP | 9-139438 | 5/1997 |
| JP | 10-233508 | 9/1998 |
| JP | 11-74511 | 3/1999 |
| JP | 11-74517 | 3/1999 |
| JP | 11-330451 | 11/1999 |
| JP | 2000-31471 | 1/2000 |

OTHER PUBLICATIONS

Japanese Office Action dated May 15, 2001, with partial English translation.

* cited by examiner

Primary Examiner—Jerome Jackson, Jr.
Assistant Examiner—Edgardo Ortiz
(74) Attorney, Agent, or Firm—McGinn & Gibb, PLLC

(57) ABSTRACT

A horizontal type DMISFET is remarkably improved in its endurance of an over-voltage applied to a drain electrode thereof. In this MIS type semiconductor device, an N⁺-type source region assuming an octagonal-shaped configuration in plan view is selectively formed in a first P-type base region in a manner such that the N⁺-type source region is disposed adjacent to a peripheral portion of a P⁺-type base region, provided that the N⁺-type source region is not disposed on a center line through which a center of an N⁺-type drain region is connected with a center of the first P-type base region.

7 Claims, 10 Drawing Sheets

MIS TYPE SEMICONDUCTOR DEVICE AND METHOD FOR MANUFACTURING THE SAME

BACKGROUND OF THE INVENTION

1. Field of the Invention

The present invention relates to a MIS (i.e., Metal Insulator Semiconductor) type semiconductor device and a method for manufacturing the same, and more particularly to a horizontal type DMISFET (i.e., Double-diffused MIS Field Effect Transistor) and a method for manufacturing the same.

2. Description of the Related Art

Heretofore, DMOSFETs (i.e., Double-diffused Metal Oxide Semiconductor Field Effect Transistors) have been known as semiconductor power devices for controlling both a relatively large current and a relatively large voltage. Of these DMOSFETs, a horizontal type DMOSFET has its drain electrode disposed in its surface. According to principles of the FET, the horizontal type DMOSFET uses either electrons or electric holes as its majority carriers in operation, and is therefore free from any stored carrier effect. Due to this freedom, the horizontal type DMOSFET is excellent in switching characteristic and in punch-through resistance. Consequently, the horizontal type DMOSFET has widely been used in inductive loads, for example such as switching regulators and the like instruments.

FIG. 15 shows a plan view of a conventional horizontal MIS type semiconductor device. FIG. 16 shows a cross-sectional view of the conventional horizontal MIS type semiconductor device shown in FIG. 15. Incidentally, the cross-sectional view shown in FIG. 16 is taken along a center line L through which a center of a drain region is connected with a center of a base region in the conventional MIS type semiconductor device. Hereinbelow, the conventional horizontal MIS type semiconductor device will be described.

As shown in FIG. 16, the conventional horizontal MIS type semiconductor device, more particularly, conventional DMOSFET uses a $P^+$-type silicon substrate 51 in which a $P^-$-type region 52 for example is previously formed by a suitable crystal growth process such as epitaxial growth processes. Selectively formed in this $P^-$-type region 52 is an N-type well region 53. Selectively formed in a major surface of the thus formed N-type well region 53 is a first P-type base region 54. Selectively formed in this first P-type base region 54 is a $P^+$-type base region 55. On the other hand, selectively formed in the N-type well region 53 is an $N^+$-type drain region 56. Further, selectively formed in the first P-type base region 54 is an annular $P^+$-type source region 57 which is disposed adjacent to a peripheral portion of the $P^+$-type base region 55. This annular $P^+$-type source region 57 is oppositely disposed from the $N^+$-type drain region 56. A gate electrode 59 is formed on a gate oxide (i.e., insulation) film 58 which is formed between the annular $P^+$-type source region 57 and the $N^+$-type drain region 56. Incidentally, in FIG. 15, the reference numeral 60 denotes an element isolation insulation film.

A first interlayer insulation film 61 is formed to cover the entire surface of the semiconductor device including the gate electrode 56. As is clear from FIG. 16, a first contact window 62 is formed on the $N^+$-type drain region 56 of this first interlayer insulation film 61. Through the first contact window 62, a first layer drain electrode 63 extends upward. On the other hand, a second contact window 64 is formed on both the $P^+$-type base region 55 and the annular $P^+$-type source region 57. Through the second contact window 64, a source electrode 65 extends upward, as shown in FIG. 16. A second interlayer insulation film 66 is formed to cover the entire surface of the semiconductor device including both the first layer drain electrode 63 and the source electrode 65. A third contact window 67 is formed on the first layer drain electrode 63 in the second interlayer insulation film 66. Through the third contact window 67, a second layer drain electrode 68 extends upward. The first layer drain electrode 63 is combined with the second layer drain electrode 68 to form a drain electrode assembly. The thus formed semiconductor device has its surface covered with a cover insulation film 69. In this conventional horizontal MIS type semiconductor device, as is clear from FIG. 15, the first P-type base region 54 assumes an octagonal-shaped configuration in plan view to improve the semiconductor device in integration density (i.e., cell density per unit area).

However, the conventional horizontal type DMOSFET has the disadvantage that: when an over-voltage such as surge voltages and counter electromotive forces caused when the DMOSFET connected with an inductive load is turned off is applied to a drain electrode of the DMOSFET, both the displacement current and the breakdown current are forced to flow, so that the DMOSFET is impaired in its endurance of high potential (i.e., over-voltage) failure. In other words, the displacement current concentrates in an area situated on a center line L (shown in FIG. 15) along which is defined the shortest distance between the $N^+$-type drain region 56 and the annular $P^+$-type source region 57 which is oppositely disposed from the $N^+$-type drain region 56. Concentration of the displacement current in the above area is due to the fact that the area in the above-mentioned shortest distance is lowest in resistance to the displacement current. On the other hand, the breakdown current concentrates in each of the corner portions of the polygonal-shaped first P-type base region 54 since the electric field strength is large in each of these corner portions of the first base region 54.

When both the displacement current and the breakdown current flow in a manner described above, a PN junction formed between the base and the emitter (i.e., between the first base region 54 and the annular $P^+$-type source region 57) of a parasitic NPN transistor (which is constructed of: the N-type well region 53 serving as a collector; the P-type first base region 54 serving as a base; and, the annular $P^+$-type source region 57 serving as an emitter) is forward-biased, which facilitates the turn-on action of the above-mentioned parasitic NPN transistor. As a result, current concentration is induced, which leads to a high potential failure of the conventional horizontal type DMOSFET. Due to this, the conventional horizontal type DMOSFET is poor in its endurance of high potential failure.

Another conventional horizontal type DMOSFET improved in its endurance of an over-voltage applied to its drain electrode is disclosed, for example, in Japanese Patent Laid-Open No. Hei9-139438 in which: a deep P-type base region is formed in a first P-type base region in a manner such that the deep P-type base region is larger in depth than the first P-type base portion to decrease in base resistance a parasitic NPN transistor of the DMOSFET, which makes it hard to turn on the parasitic NPN transistor so that an object of the conventional DMOSFET disclosed in the Japanese Patent Laid-Open No. Hei9-139438 is accomplished.

Another conventional but vertical type DMOSFET improved in its endurance of an over-voltage applied to its drain electrode is disclosed, for example, in Japanese Patent Laid-Open No. Hei6-97448 in which: a corner portion of a P-type base region is made free from any formation of an N+-type source region; and, an $h_{FE}$ (i.e., common-emitter static forward current transfer ratio) in the corner portion of the P-type base region is lowered together with the base resistance of a parasitic NPN transistor of the DMOSFET to make it hard to turn on this parasitic NPN transistor.

However, the conventional horizontal type DMOSFET disclosed in the Japanese Patent Laid-Open No. Hei9-139438 has the disadvantage that: since the deep P-type base region is made deeper in depth than the first base region in order to lower the base resistance of the parasitic NPN transistor, the conventional horizontal type DMOSFET increases in the number of process steps in manufacturing thereof, and is hard to fabricate due to its delicate region structures, which makes it hard to improve the conventional horizontal type DMOSFET in integration density.

On the other hand, although the other conventional but vertical type DMOSFET disclosed in the Japanese Patent Laid-Open No. Hei6-97448 is effective against the breakdown current, it has the disadvantage that: since no consideration is given to the displacement current, concentration of the displacement current occurs.

SUMMARY OF THE INVENTION

In view of the above, it is an object of the present invention to provide a MIS (i.e., Metal Insulator Semiconductor) type semiconductor device and a method for manufacturing the same, and more particularly to a horizontal type DMISFET (i.e., Double-diffused MIS Field Effect Transistor) and a method for manufacturing the same, wherein the horizontal type DMISFET of the present invention is improved in its endurance of an over-voltage applied to its drain electrode.

According to a first aspect of the present invention, there is provided a MIS type semiconductor device comprising:
 a semiconductor substrate;
 a high concentration drain region of a first conductive type selectively formed in a major surface of the semiconductor substrate;
 a first base region of a second conductive type selectively formed in the major surface of the semiconductor substrate so as to be separated from the high concentration drain region;
 a source region of the first conductive type formed in the first base region of the second conductive type; and
 an insulated-type gate electrode formed between the source region of the first conductive type and the high concentration drain region of the first conductive type;
 wherein the source region of the first conductive type is not disposed on a center line through which, in plan view, a center of the high concentration drain region of the first conductive type is connected with a center of the base region of the second conductive type.

In the foregoing, a preferable mode is one wherein:
a high concentration base region of the second conductive type is selectively formed in the first base region of the second conductive type; and
the source region of the first conductive type is disposed adjacent to a peripheral portion the high concentration base region of the second conductive type.

Also, a preferable mode is one wherein:
the first base region of the second conductive type has its outline formed into a polygonal-shaped configuration in plan view;
the source region of the first conductive type has its source portions not disposed on the center line, the source portions corresponding to corner portions of the polygonal-shaped configuration;

Also, a preferable mode is one wherein:
the first base region of the second conductive type assumes a polygonal-shaped configuration in plan view; and
the source region of the first conductive type is not disposed in any corner portions of the polygonal-shaped configuration.

Furthermore, a preferable mode is one wherein: a plurality of the source regions each of the first conductive type and a plurality of the high concentration drain regions each of the first conductive type are provided.

According to a second aspect of the present invention, there is provided a method for manufacturing a MIS type semiconductor device comprising: a semiconductor substrate; a high concentration drain region of a first conductive type selectively formed in a major surface of the semiconductor substrate; a first base region of a second conductive type selectively formed in the major surface of the semiconductor substrate so as to be separated from the high concentration drain region; a source region of the first conductive type formed in the first base region of the second conductive type; and, an insulated-type gate electrode formed between the source region of the first conductive type and the high concentration drain region of the first conductive type; the method comprising the step of:
 selectively forming the first base region of the second conductive type in the main surface of the semiconductor substrate;
 selectively forming the high concentration base region of the second conductive type in the first base region of the second conductive type;
 selectively forming the high concentration drain region of the first conductive type in the semiconductor substrate; and
 selectively forming the source region of the first conductive type in the first base region of the second conductive type so as to be disposed adjacent to a peripheral portion of the high concentration base region of the second conductive type but not disposed on a center line through which, in plan view, a center of the high concentration drain region of the first conductive type is connected with a center of the base region of the second conductive type.

In the foregoing, a preferable mode is one wherein: the step of selectively forming the high concentration drain region of the first conductive type and the step of selectively forming the first base region of the second conductive type are simultaneously performed.

As described above, in the MIS type semiconductor device of the present invention and the method of the present invention for manufacturing the semiconductor device each having the above construction, since the source region of the first conductive type is formed in configuration in plan view so as to be not disposed on the center line through which the center of the drain region of the first conductive type is connected with the center of the first base region of the second conductive type, it is possible for the semiconductor device of the present invention to suppress any concentration of both the displacement current and the breakdown current therein, which makes it hard to turn on the parasitic NPN transistors.

Consequently, the horizontal type DMISFET of the present invention having the above construction is remarkably improved in its endurance of an over-voltage applied to the drain electrode thereof.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Figure 1:
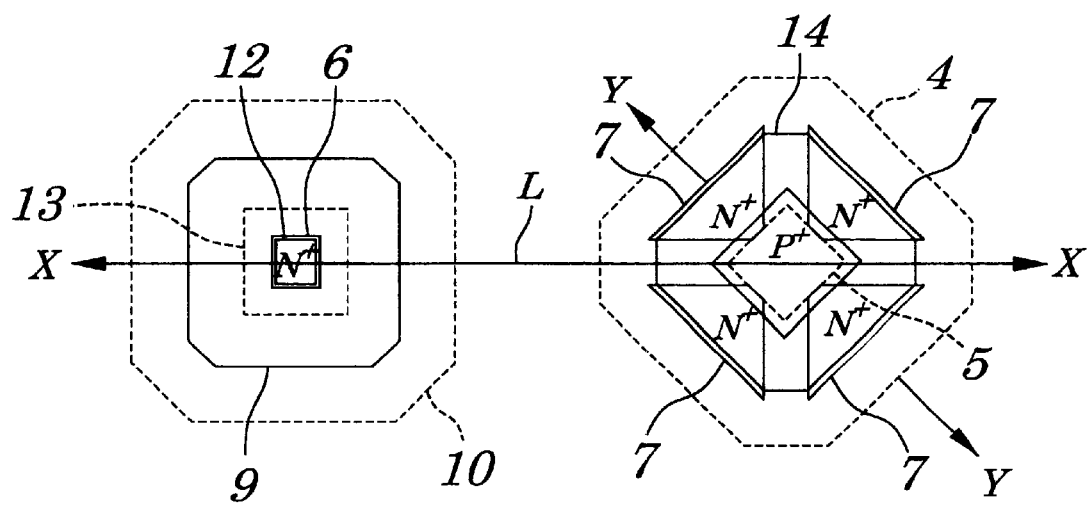
FIGS. 1 is a plan view of a first embodiment of the MIS type semiconductor device of the present invention.

The best modes for carrying out the present invention will be described in detail using embodiments of the present invention with reference to the accompanying drawings.

The present invention may, however, be embodied in various different forms and should not be construed as limited to the embodiments set forth herein; rather, these embodiments are provided so that this disclosure will be thorough and complete, and will fully convey the scope of the present invention to those skilled in the art.

In the accompanying drawings, the thickness of films and regions are exaggerated for clarity. Like reference numerals refer to like parts throughout the drawings.

Incidentally, it will also be understood that when a layer or film is referred to as being "on" another film or substrate, it can be directly on such another film or substrate, or intervening films may also be present therebetween.

First Embodiment

A first embodiment of a horizontal MIS type semiconductor device of the present invention is shown in FIGS. 1 to 7C.

Figure 2:
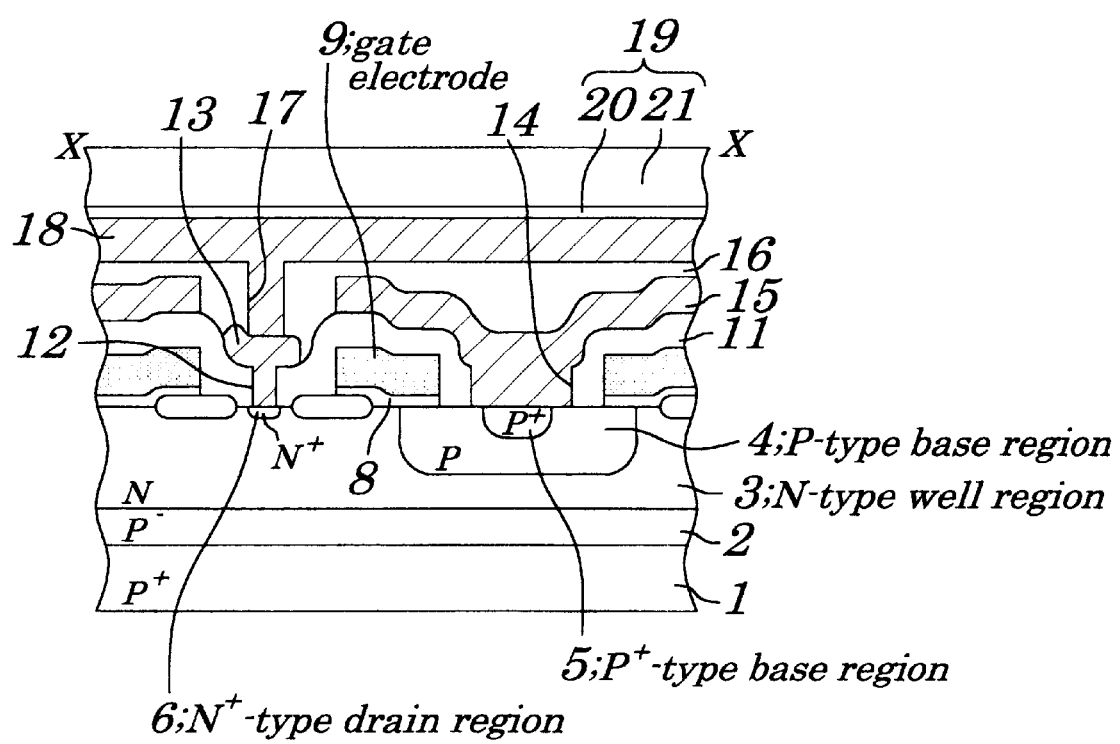
FIG. 2 is a cross-sectional view of the first embodiment of the present invention, taken along the line X—X of FIG. 1.
Figure 3:
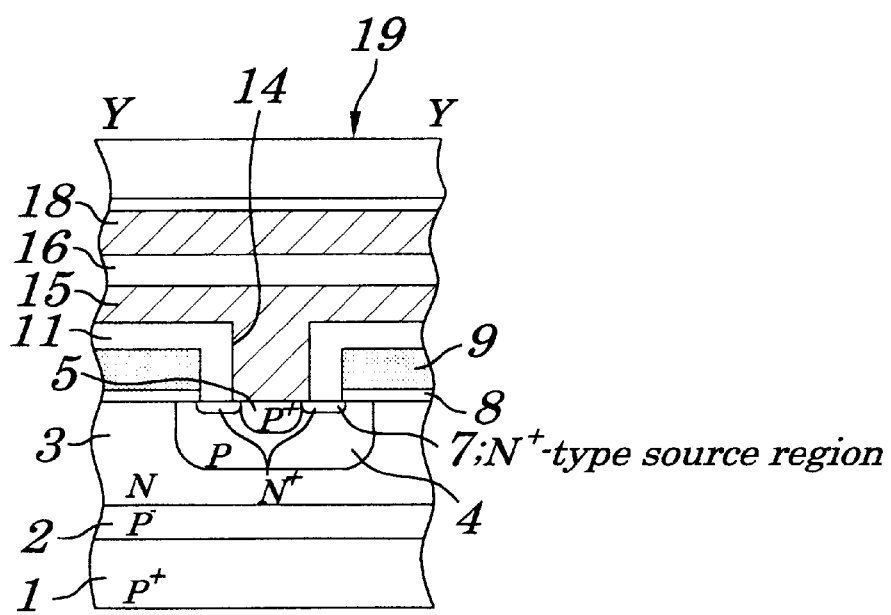
FIG. 3 is a cross-sectional view of the first embodiment of the present invention, taken along the line Y—Y of FIG. 1.

As shown in FIGS. 1 to 3, the first embodiment of the MIS type semiconductor device of the present invention uses a $P^+$-type silicon substrate 1 in which a $P^-$-type region 2 for example is previously formed by a suitable crystal growth process such as epitaxial growth processes. Selectively formed in this $P^-$-type region 2 is an N-type well region 3. Selectively formed in a major surface of the thus formed N-type well region 3 is a first P-type base region 4. Selectively formed in this first P-type base region 4 is a $P^+$-type base region 5. On the other hand, selectively formed in the N-type well region 3 is an $N^+$-type drain region 6.

On the other hand, selectively formed in the first P-type base region 4 is an $N^+$-type source region 7 which assumes a substantially octagonal-shaped configuration disposed adjacent to a peripheral portion of the $P^+$-type base region 5, provided that: as is clear from FIGS. 1 to 3, this $N^+$-type source region 7 is not formed on a center line L through which a center of the $N^+$-type drain region 6 is connected with a center of the first P-type base region 4. Further, the $N^+$-type source region 7 is not formed on a line extending in a direction perpendicular to the center line L. In other words, the $N^+$-type source region 7 is not formed in any corner portions of the octagonal-shaped configuration of the $N^+$-type source region 7. More specifically, the $N^+$-type source region 7 is not formed in any corner portion of the octagonal-shaped configuration, which portion is oppositely disposed from the $N^+$-type drain region 6 and situated nearest to the $N^+$-type drain region 6.

By patterning the $N^+$-type source region 7 in a manner as described above, it is possible to prevent the $N^+$-type source region 7 from being formed in the above-mentioned corner portion situated nearest to the $N^+$-type drain region 6. Consequently, it is possible for the first embodiment of the horizontal MIS type semiconductor device of the present invention to decrease both the base resistance and a parasitic $h_{FE}$ (i.e., common-emitter static forward current transfer ratio) in an area where concentration of the displacement current occurs. Further, in the first embodiment of the horizontal MIS type semiconductor device of the present invention, the $N^+$-type source region 7 is not formed in any corner portions of the octagonal-shaped configuration, it is possible to decrease both the base resistance and the parasitic $h_{FE}$ in an area where concentration of the breakdown current occurs.

Consequently, in the first embodiment of the horizontal MIS type semiconductor device of the present invention, since both the base resistance and the parasitic $h_{FE}$ decrease in the areas where concentration of the displacement current and the breakdown current occurs, the parasitic NPN transistor is hard to turn on.

Formed between the $N^+$-type drain region 6 and the $N^+$-type source region 7 is a gate oxide film 8 on which a gate electrode 9 is formed. In FIG. 1, the reference numeral 10 denotes an element isolation insulation film. As is clear from FIG. 2, a first interlayer insulation film 11 formed of a BPSG (i.e., Boron-Phosphorus-Silicate Glass) is formed to cover the entire surface of the semiconductor device including the gate electrode 9. A first contact window 12 is formed on the $N^+$type drain region 6 in the first interlayer insulation film 11. A first layer drain electrode 13 extends upward through the first contact window 12. On the other hand, a second contact window 14 is formed on both the P⁺-type base region 5 and the N⁺-type source region 7 in the first interlayer insulation film 11. A source electrode 15 extends upward through the second contact window 14.

A second interlayer insulation film 16 formed of a silicon oxide film is formed to cover the entire surface of the semiconductor device including both the first layer drain electrode 13 and the source electrode 15. A third contact window 17 is formed on the first layer drain electrode 13 in the second interlayer insulation film 16. A second layer drain electrode 18 formed of an aluminum film extends upward through the third contact window 17. The first layer drain electrode 13 is combined with the second layer drain electrode 18 to form a drain electrode assembly 18. Finally, as shown in FIG. 2, the entire surface of the semiconductor device is covered with a cover insulation film 19. This cover insulation film 19 is formed of a laminated film in which a polyimide film 21 is laminated to a silicon nitride film 20.

Figure 4:
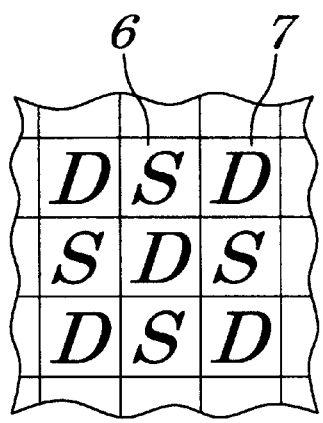
FIG. 4 is a plan view of the first embodiment of the present invention shown in FIG. 1, illustrating in arrangement a plurality of unit cells forming the MIS semiconductor device of the present invention.

FIG. 4 shows a plan view of the first embodiment of the horizontal MIS type semiconductor device of the present invention shown in FIG. 1, illustrating in arrangement a plurality of unit cells forming the MIS semiconductor device of the present invention, wherein: a plurality of the N⁺-type source region 7 and a plurality of the N⁺-type drain region 6 are arranged into a plurality of rows and columns each of which extends in a direction perpendicular to the rows; and, in each of these rows and columns, the N⁺-type drain region 6 each of which assumes a square shape in plan view are spaced alternately with the N⁺-type source region 7 each of which assumes a square shape in plan view Next, with reference to FIGS. 5A to 7C, a series of processing step performed in a method of the present invention for manufacturing the first embodiment of the horizontal MIS type semiconductor device of the present invention shown in FIG. 1 will be described in the order of these drawings.

Figure 5A:
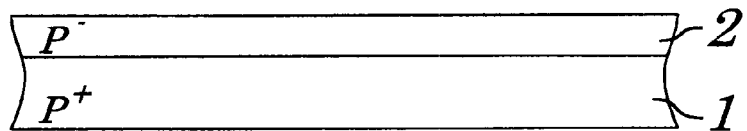
FIGS. 5A to 5C are individual cross-sectional views of the semiconductor device of the present invention shown in FIG. 1, illustrating the method for manufacturing the same.
Figure 5B:
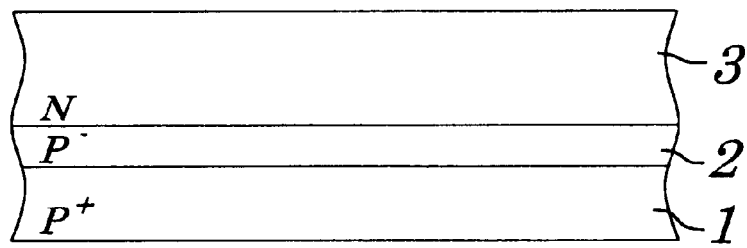

First, as shown in FIG. 5A, the P⁺-type silicon substrate 1 in which the P-type region 2 for example is previously formed by a suitable crystal growth process such as epitaxial growth processes is prepared. Then, selectively formed in this P⁻type region 2 of the P⁺-type silicon substrate 1 is a silicon oxide film (not shown) having a film thickness of approximately 480 nm. After that, an N-type well region 3 is selectively formed in the p-type region 2 by a first ion implantation process and a first heat treatment subsequent to the first ion implantation process. More specifically, in the first ion implantation process: the above-mentioned silicon oxide film is used as a mask; and, phosphorus serving as an impurity is injected into the p-type region 2 at a dose of $2.2 \times 10^{12}$ atoms/cm² using an ion energy of approximately 150 keV (i.e., kilo electron volts). The p-type region 2 thus doped with phosphorus is then subjected to the first heat treatment for a period of approximately ten hours at a temperature of approximately 1200° C., so that the N-type well region 3 is selectively formed in the p-type region 2.

Figure 5C:
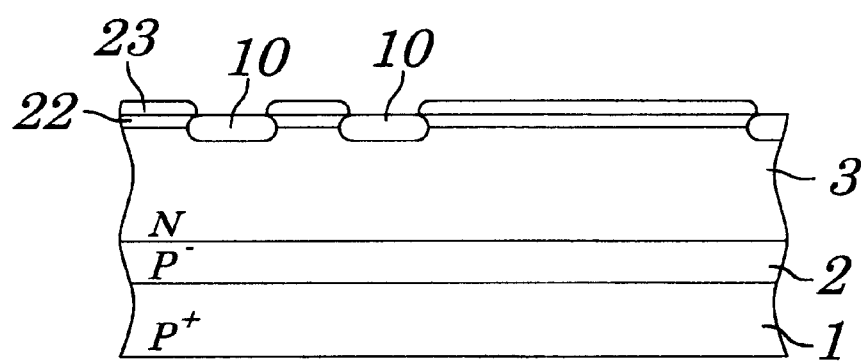

Then, as shown in FIG. 5C, selectively formed in a major surface (in which an element should be formed) of the thus formed N-type well region 3 is a laminated film (22, 23) constructed of a silicon oxide film 22 laminated with a silicon nitride film 23 serving as an oxidation resistance mask. The silicon oxide film 22 has a film thickness of approximately 30 nm. On the other hand, the silicon nitride film 23 has a film thickness of approximately 180 nm. After completion of formation of the laminated film (22, 23), the semiconductor device is subjected to a second thermal oxidation process so that an element isolation insulation film 10 having a film thickness of approximately 480 nm is formed.

Figure 6A:
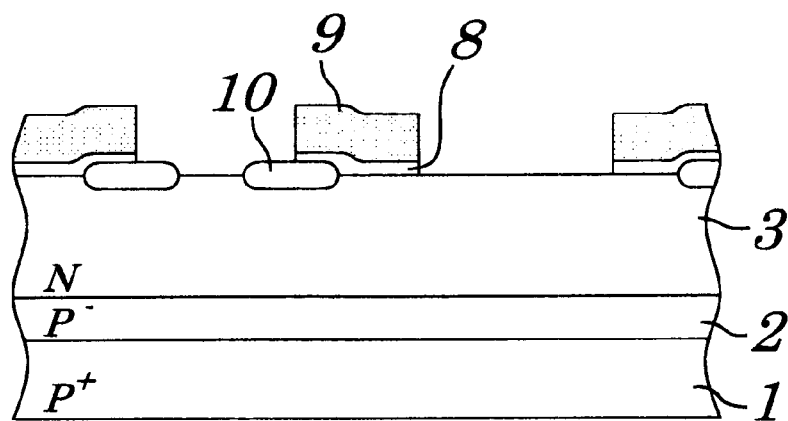
FIGS. 6A to 6C are individual cross-sectional views of the semiconductor device of the present invention shown in FIG. 1, illustrating the method for manufacturing the same.

After formation of the element isolation insulation film 10, both the silicon oxide film 22 and the silicon nitride film 23 are removed. Then, the semiconductor device is subjected to a third thermal oxidation process, so that another silicon oxide film having a film thickness of approximately 25 nm is formed. Subsequent to this third thermal oxidation process, a CVD (i.e., Chemical Vapor Deposition) process is carried out, so that a polysilicon film having a film thickness of approximately 450 nm is formed. Subsequent to this CVD process, a lithography process is carried out to pattern both the silicon oxide film and the polysilicon film, so that a gate oxide film 8 and a gate electrode 9 are formed, wherein the gate electrode 9 is disposed on the gate oxide film 8, as shown in FIG. 6A.

Figure 6B:
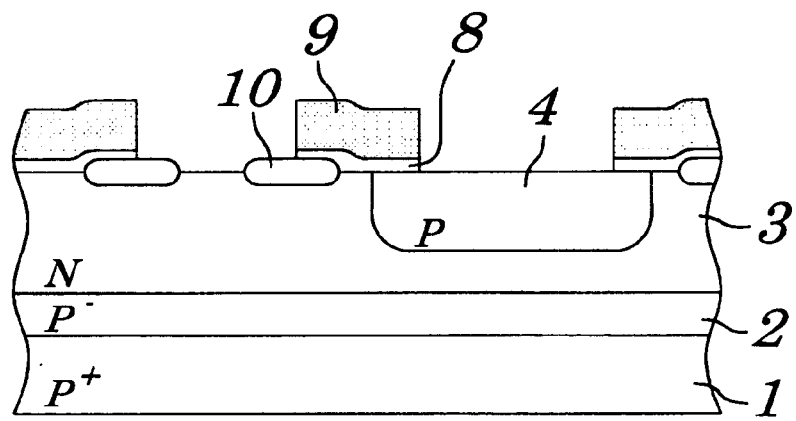
Figure 6C:
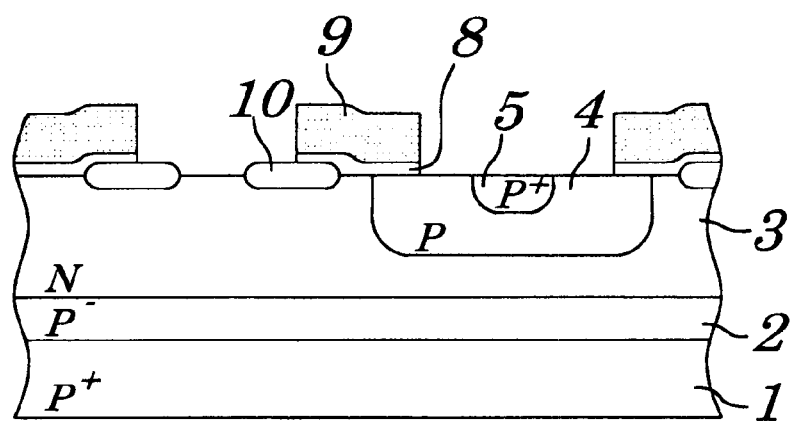

After completion of formation of the gate electrode 9, a side wall silicon film (not shown) having a film thickness of approximately 30 nm is formed so as to be disposed adjacent to a side surface of the gate electrode 9. Then, unnecessary portions of a resist mask having been applied to the entire surface of the semiconductor device are removed. Subsequent to this removal of the unnecessary portions of the resist mask, a second ion implantation process is carried out with the use of arsenic as an impurity at a dose of $5.5 \times 10^{13}$ atoms/cm² using an ion energy of approximately 150 keV. The N-type well region 3 thus doped with arsenic is then subjected to a second heat treatment for a period of approximately 25 minutes at a temperature of approximately 1140° C., so that a P-type base region 4 is selectively formed in the N-type well region 3, as shown in FIG. 6B. After that, unnecessary portions of the resist mask having been applied to the entire surface of the semiconductor device are removed. Subsequent to this removal of the unnecessary portions of the resist mask, a third ion implantation process is carried out with the use of arsenic as an impurity at a dose of approximately $4.0 \times 10^{15}$ atoms/cm² using an ion energy of approximately 70 keV, which is followed by a third heat treatment carried out at a temperature of approximately 1000° C. for a period of approximately 30 minutes, so that a P⁺-type base region 5 is formed in the P-type base region 4, as shown in FIG. 6C.

Figure 7A:
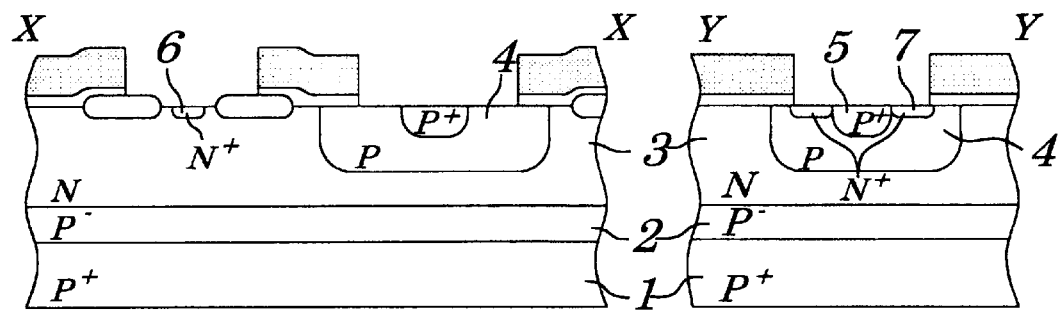
FIGS. 7A to 7C are individual cross-sectional views of the semiconductor device of the present invention shown in FIG. 1, illustrating the method for manufacturing the same.

Then, unnecessary portions of the resist mask applied to the entire surface of the semiconductor device are removed. After that, a fourth ion implantation process is carried out with the use of arsenic as an impurity at a dose of $1.0 \times 10^{16}$ atoms/cm² using an ion energy of approximately 70 keV. The N-type well region 3 thus doped with arsenic is then subjected to a fourth heat treatment for a period of approximately 30 minutes at a temperature of approximately 1000° C., so that a P⁺-type drain region 6 is selectively formed in the N-type well region 3, as shown in FIG. 7A. At the same time, an N⁺-type source region 7 (shown in FIG. 1) is formed so as to be disposed adjacent to a peripheral portion of the P⁺-type base region 5 in plan view, provided that: as is clear from FIGS. 1 to 3, the N⁺-type source region 7 is not disposed on a center line L through which a center of the P-type base region 4 is connected with a center of the P⁺-type drain region 6.

Further, the N⁻-type source region 7 is not disposed on a line extending in a direction perpendicular to the center line L, as is clear from FIG. 1. Incidentally, the reference capital letters "X" and "Y" of FIG. 7A denote the same directions as those denoted by the same reference capital letters "X" and "Y" of FIG. 1, respectively.

Figure 7B:
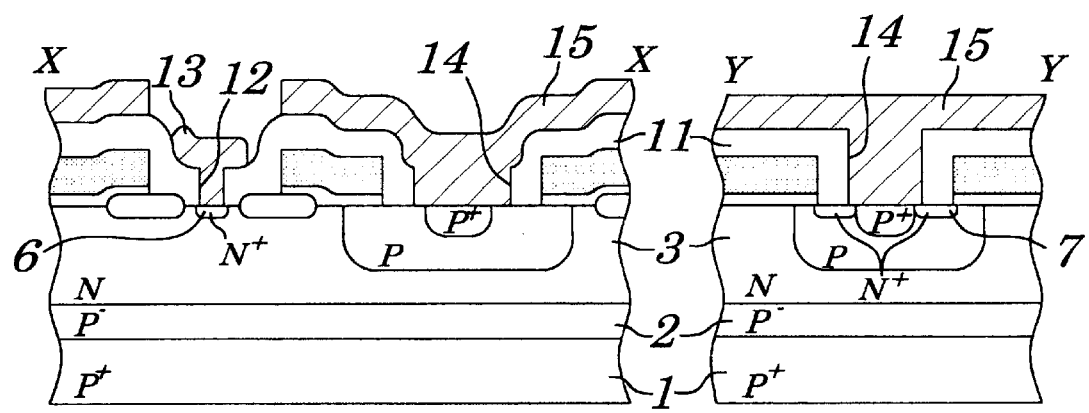

Then, as shown in FIG. 7B, a first interlayer insulation film 11 formed of a BPSG film having a thickness of approximately 1.4 μm is formed by the CVD process to cover the entire surface of the semiconductor device. After that, this first interlayer insulation film 11 is patterned, so that a first contact window 12 is formed on the P$^+$-type drain region 6 in the first interlayer insulation film 11. At the same time, a second contact window 14 is formed on both the P$^+$-type base region 5 and the N$^+$-type source region 7 in the first interlayer insulation film 11.

Then, an aluminum film having a film thickness of approximately 1.0 μm is formed by a first sputtering process to cover the entire surface of the semiconductor device. The thus formed aluminum film is then patterned, so that a first layer drain electrode 13 and a source electrode 15 are formed.

Figure 7C:
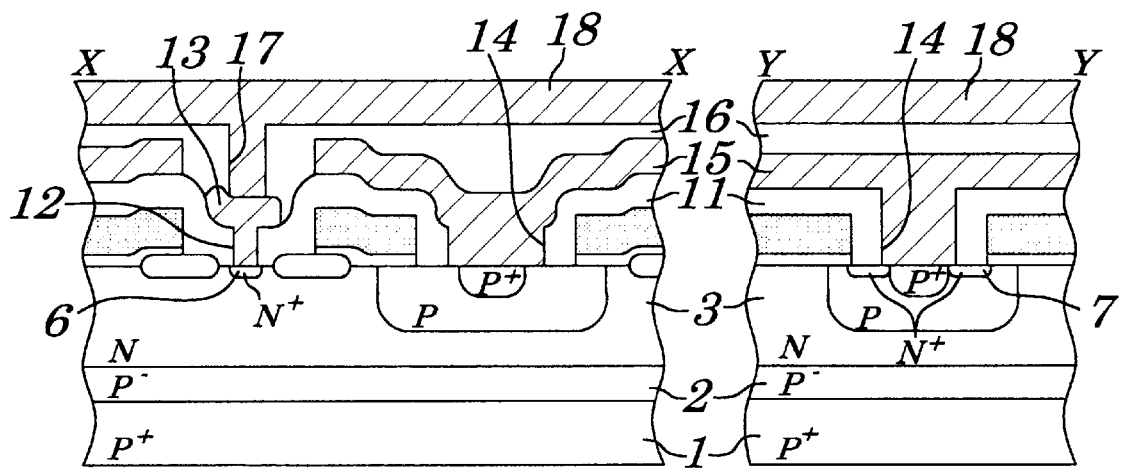

After that, as shown in FIG. 7C, a second interlayer insulation film 16 formed of a silicon oxide film having a film thickness of approximately 1.4 μm is formed by the CVD process to cover the entire surface of the semiconductor device. The second interlayer insulation film 16 thus formed is then patterned, so that a third contact window 17 is formed on the first layer drain electrode 13 in the second interlayer insulation film 16. After that, an aluminum film having a film thickness of approximately 2.0 μm is formed by a second sputtering process to cover the entire surface of the semiconductor device. The thus formed aluminum film is then patterned, so that a second layer drain electrode 18 is formed.

Next, the entire surface of the semiconductor device is covered with a cover insulation film 19. This cover insulation film 19 is formed by the CVD process to assume a laminated form in which a polyimide film 21 is laminated to a silicon nitride film 20. The first embodiment of the horizontal MIS type semiconductor device of the present invention is completed in a manner described above.

In this first embodiment of the present invention having the above construction, since the N$^+$-type source region 7 is not formed on the center line L (shown in FIG. 1) through which a center of the N$^+$-type drain region 6 is connected with a center of the first P-type base region 4, it is possible for the first embodiment of the horizontal MIS type semiconductor device of the present invention to decrease both the base resistance and the parasitic $h_{FE}$ (i.e., common-emitter static forward current transfer ratio) in an area where concentration of the displacement current and the breakdown current occurs, and thereby making it hard to turn on the parasitic NPN transistor.

Consequently, the horizontal MIS type semiconductor device (i.e., horizontal type DMISFET) of the present invention is remarkably improved in its endurance of an overvoltage applied to its drain electrode.

Second Embodiment

Figure 8:
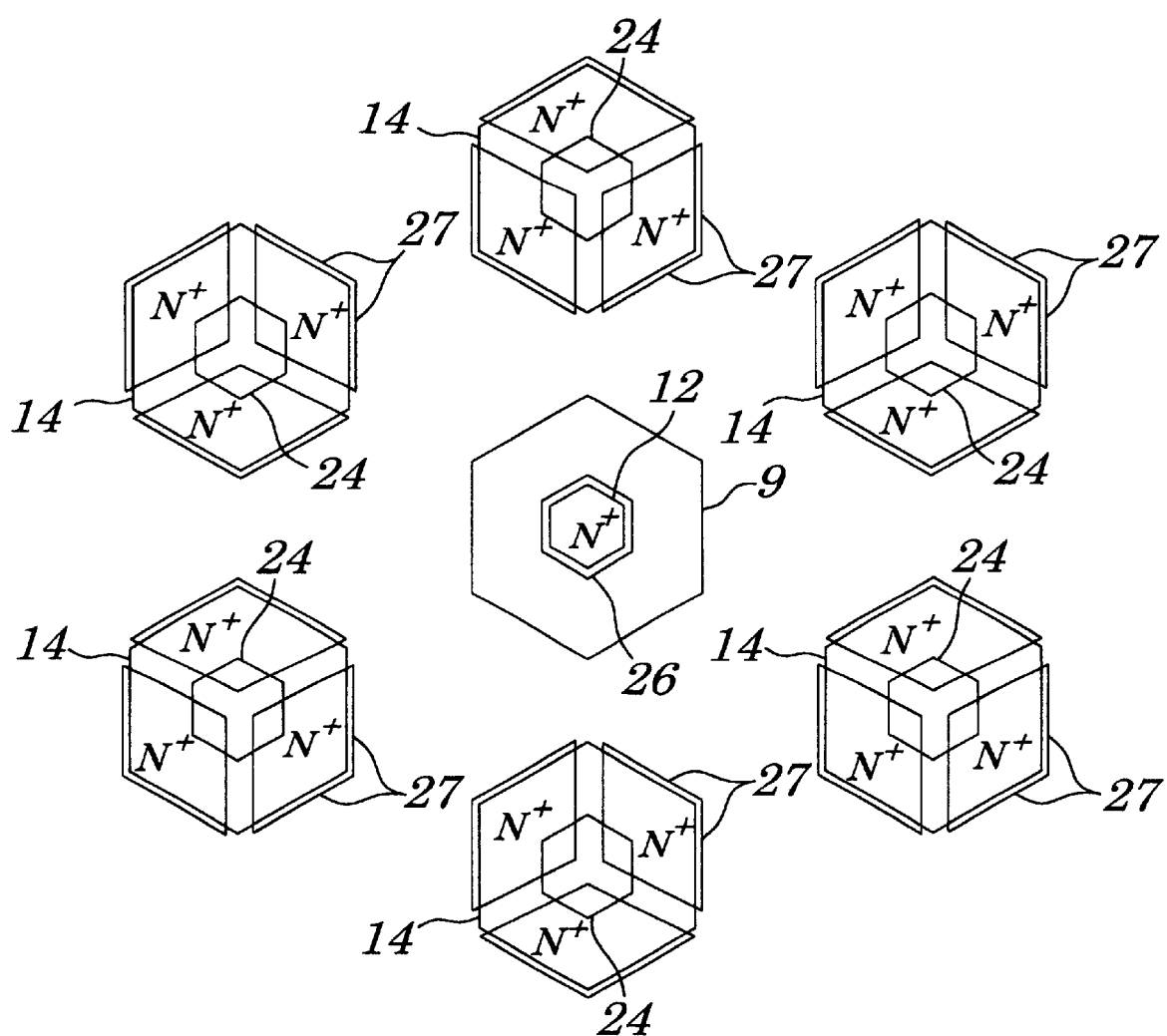
FIG. 8 is a plan view of a second embodiment of the MIS type semiconductor device of the present invention.
Figure 9:
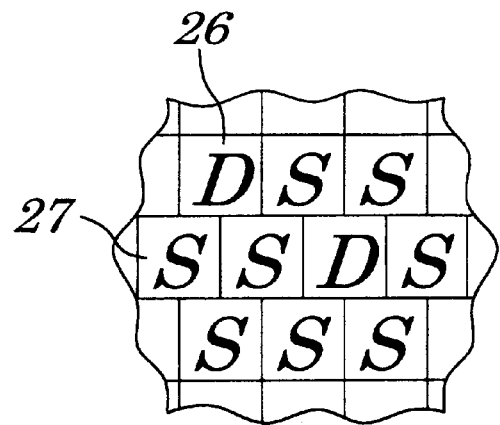
FIG. 9 is a plan view of the second embodiment of the present invention shown in FIG. 8, illustrating in arrangement a plurality of unit cells forming the MIS semiconductor device of the present invention.

FIG. 8 shows a plan view of a second embodiment of the MIS type semiconductor device of the present invention. FIG. 9 is a plan view of the second embodiment of the present invention shown in FIG. 8, illustrating in arrangement a plurality of unit cells forming the MIS semiconductor device of the present invention.

In construction, the second embodiment of the present invention is substantially similar to the first embodiment of the present invention described above except that: in this second embodiment of the present invention, each of its unit cells assumes a hexagonal-shaped configuration in plan view, as is clear from FIG. 8.

In the MIS type semiconductor device of the second embodiment of the present invention, six pieces of N$^+$-type source regions 27 each of which assumes a hexagonal-shaped configuration in plan view are arranged around an N$^+$-type drain region 26 which assumes a hexagonal-shaped configuration in plan view, wherein the N$^+$-type source regions 27 are spaced apart from each other at equal angular intervals of approximately 60 degrees. Here, any of the N$^+$-type source regions 27 is not disposed on the center line through which a center of the N$^+$-type drain region 26 is connected with a center of the P-type base region 24.

With the exception of the above construction, the second embodiment of the present invention is similar to the first embodiment of the present invention. Consequently, in FIGS. 8 and 9, like parts are denoted by like reference numerals used in the first embodiment of the present invention described with reference to FIGS. 1 to 3.

As is clear from the above description in construction, the second embodiment of the present invention may enjoy substantially the same effect as that obtained in the first embodiment of the present invention.

Third Embodiment

Figure 10:
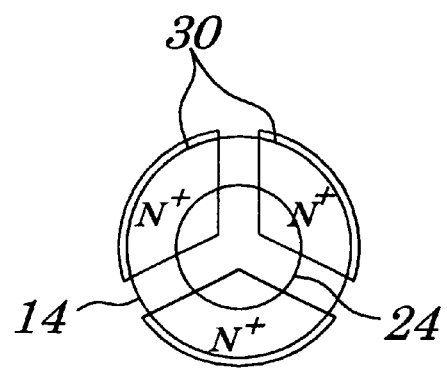
FIG. 10 is a plan view a third embodiment of the MIS type semiconductor device of the present invention.

FIG. 10 shows a plan view a third embodiment of the MIS type semiconductor device of the present invention.

In construction, the third embodiment of the present invention is substantially similar to the first embodiment of the present invention described above except that: in this third embodiment of the present invention, each of its unit cells assumes a circular configuration in plan view, as is clear from FIG. 10.

In other words, the N$^+$-type source region 30 oppositely disposed from the N$^+$-type drain region (not shown) assumes a circular shape in plan view, and is not disposed on the center line through which a center of the N$^+$-type drain region (not shown) is connected with a center of the P-type base region 24 which assumes a circular shape, in which base region 24 the N$^+$-type source region 30 is formed. Further, as is clear from FIG. 10, the N$^+$-type source regions 30 are spaced apart from each other at equal angular intervals of approximately 120 degrees.

As is clear from the above description in construction, the third embodiment of the present invention may enjoy substantially the same effect as that obtained in the first embodiment of the present invention.

Fourth Embodiment

Figure 11:
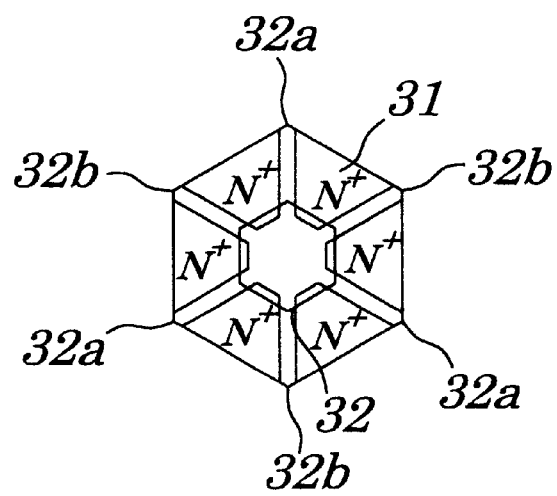
FIG. 11 is a plan view a fourth embodiment of the MIS type semiconductor device of the present invention.

FIG. 11 shows a plan view a fourth embodiment of the MIS type semiconductor device of the present invention.

In construction, the fourth embodiment of the present invention is substantially similar to the second embodiment of the present invention described above except that: in this fourth embodiment of the present invention, no source region is formed in corner portions of the hexagonal configuration shown in FIG. 11.

In other words, the N$^+$-type source region 31 oppositely disposed from the N$^+$-type drain region (not shown) assumes a hexagonal-shaped configuration in plan view. Further, the N$^+$-type source region 31 is not formed on the center line through which a center of the N$^+$-type drain region (not shown) is connected with a center of the P-type base region 32 which assumes a hexagonal-shaped configuration in plan view, in which base region 32 the N$^+$-type source region 31 is formed. Further, the N$^+$-type source region 31 is not formed on any corner portions of the P-type base region 32 which assumes a hexagonal-shaped configuration. Here, of these corner portions of the hexagonal-shaped configuration: a first one 32a is provided as a measure against both the displacement current and the breakdown current; and, a second one 32b is provided as a measure against the breakdown current.

Fifth Embodiment

Figure 12:
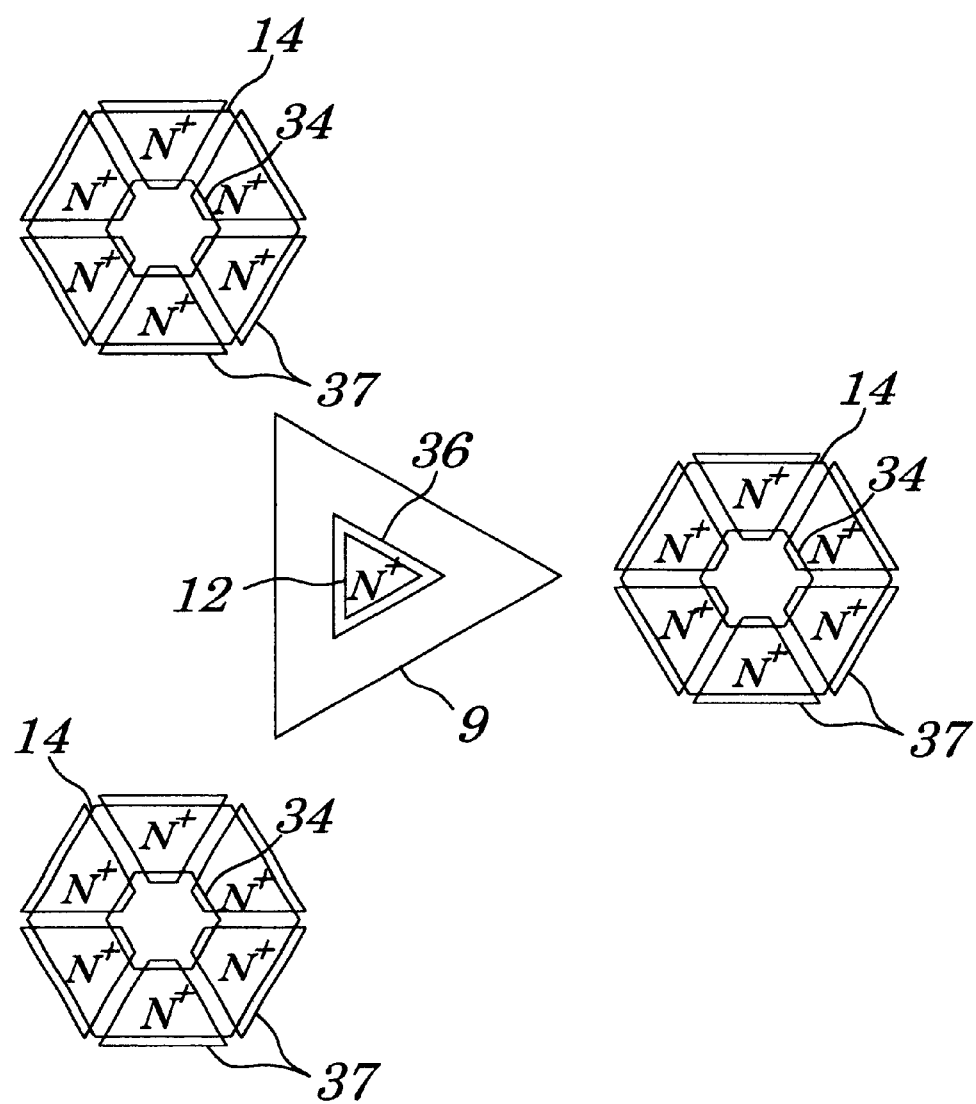
FIG. 12 is a plan view a fifth embodiment of the MIS type semiconductor device of the present invention.
Figure 13:
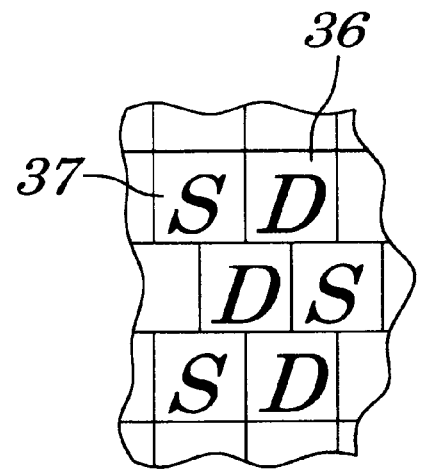
FIG. 13 is a plan view of the fifth embodiment of the present invention shown in FIG. 12, illustrating in arrangement a plurality of unit cells forming the MIS semiconductor device of the present invention.

FIG. 12 shows a plan view a fifth embodiment of the MIS type semiconductor device of the present invention. FIG. 13 shows a plan view of the fifth embodiment of the present invention shown in FIG. 12, illustrating in arrangement a plurality of unit cells forming the MIS semiconductor device of the present invention.

In construction, the fifth embodiment of the present invention is substantially similar to the first embodiment of the present invention described above except that: in this fifth embodiment of the present invention, each of its unit cells assumes a triangular-shaped configuration in plan view, as is clear from FIG. 12.

In the MIS type semiconductor device of the fifth embodiment of the present invention, three pieces of $N^+$-type source regions 37 each of which assumes a hexagonal-shaped configuration in plan view are arranged around an $N^+$-type drain region 36 which assumes a triangular-shaped configuration in plan view, wherein the $N^+$-type source regions 37 are spaced apart from each other at equal angular intervals of approximately 120 degrees. Here, the $N^+$-type source regions 37 are not disposed on the center line through which a center of the $N^+$-type drain region 36 is connected with a center of the P-type base region 34 in which each of the $N^+$-type source regions 37 is formed. Further, the $N^+$-type source regions 37 are not formed on any corner portions of the P-type base region 34.

As is clear from the above description in construction, the fifth embodiment of the present invention may enjoy substantially the same effect as that obtained in the first embodiment of the present invention.

Sixth Embodiment

Figure 14:
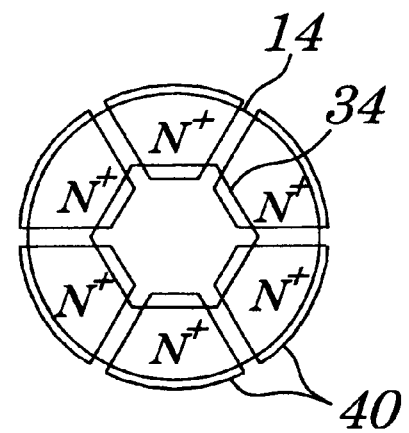
FIG. 14 is a plan view a sixth embodiment of the MIS type semiconductor device of the present invention.
Figure 15:
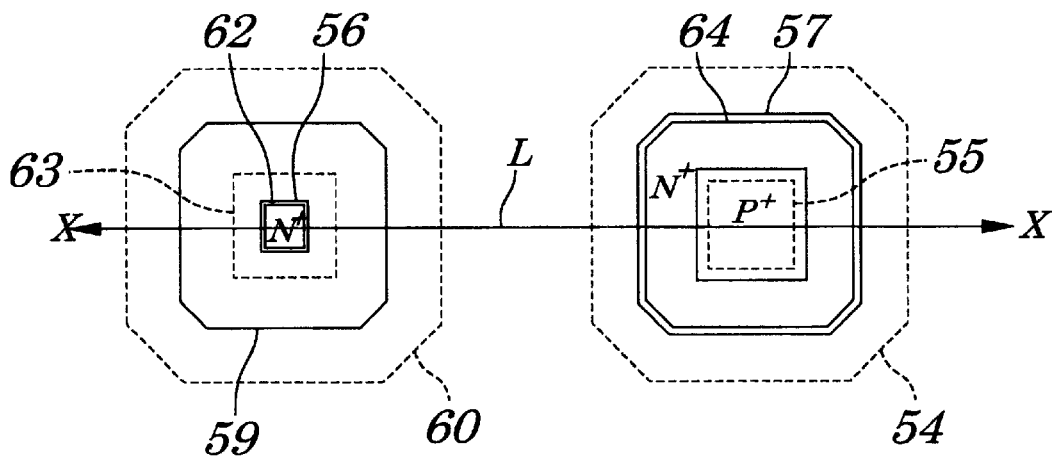
FIG. 15 is a plan view of the conventional MIS type semiconductor device.
Figure 16:
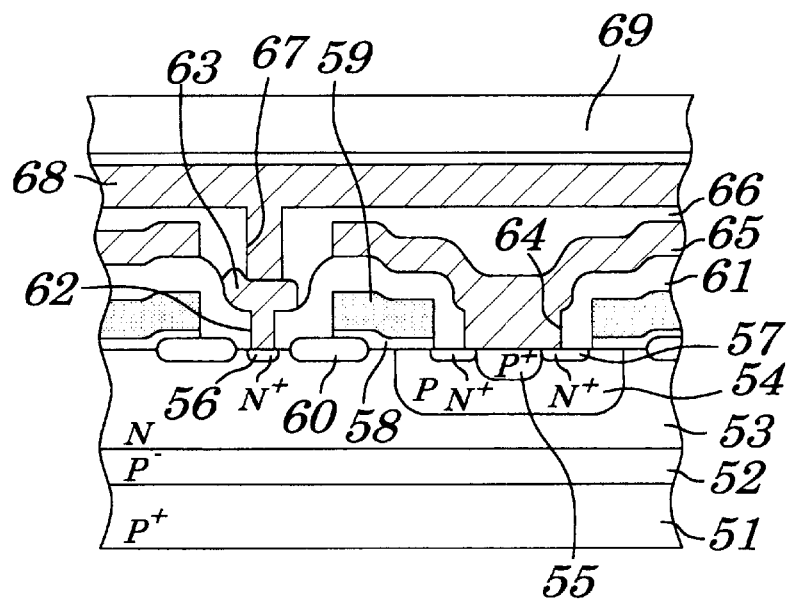
FIG. 16 is a cross-sectional view of the conventional MIS type semiconductor device shown in FIG. 15.

FIG. 14 shows a plan view a sixth embodiment of the MIS type semiconductor device of the present invention.

In construction, the sixth embodiment of the present invention is substantially similar to the fourth embodiment of the present invention described above except that: in this sixth embodiment of the present invention, each of its unit cells assumes a circular configuration in plan view, as is clear from FIG. 14.

In other words, the $N^+$-type source region 40 oppositely disposed from the $N^+$-type drain region (not shown) assumes a circular shape in plan view, and is not disposed on the center line through which a center of the $N^+$-type drain region (not shown) is connected with a center of the P-type base region 34 which assumes a circular shape, in which base region 24 the $N^+$-type source region 40 is formed. Further, as is clear from FIG. 14, the $N^+$-type source regions 40 are spaced apart from each other at equal angular intervals of approximately 60 degrees.

As is clear from the above description in construction, the sixth embodiment of the present invention may enjoy substantially the same effect as that obtained in the fourth embodiment of the present invention.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the present invention.

In the above alternations and modifications, for example, the gate oxide film is not limited to an oxide film. Namely, a nitride film may be used in place of the oxide film. Further, a double-layered film constructed of an oxide film and a nitride film may be used in place of the above oxide film serving as the gate oxide film. In other words, the present invention is applicable to any types of the MIS type transistors comprising the MOS type transistors, MNS (i.e., Metal Nitride Semiconductor) type transistors, MNOS (i.e., Metal Nitride Oxide Semiconductor) type transistors, and like transistors.

Further, in the embodiments of the present invention, the high concentration drain region thereof is changeable to a reverse conduction type so as to form a horizontal IGBT (i.e., Insulated Gate Bipolar Transistor), which may ensure substantially the same effect as that obtained in the embodiment of the present invention.

Further, although the N-type well region of self-isolation type has been already described in the embodiments of the present invention, it is possible to use a junction isolation structure using an N-type epitaxial layer in place of this N-type well region. In this case, it is possible to form an $N^+$-type buried layer between the N-type epitaxial layer and the P-type substrate, wherein the high concentration drain region is increased in depth to such an extent that the high concentration drain region reaches this $N^+$-type buried layer, which brings substantially the same effect as that obtained in the above embodiments of the present invention.

Further, in each of the semiconductor regions of the embodiments of the present invention, the P-type conduction regions are replaceable with the N-type conduction regions, or vice versa. In other words, the present invention is applicable to a P-channel type MIS transistors in addition to the N-channel type MIS transistors.

Further, the interlayer insulation film may be constructed of any other suitable film in addition to the silicon oxide film and BPSG film, for example such as BSG (i.e., Boron-Silicate Glass) films, PSG (i.e., Phosphorus-Silicate Glass) films and like insulation films. Still further, in the above embodiments of the present invention, all the above-mentioned requirements or conditions of the ion implantation processes and the heat treatment processes both performed in the various semiconductor regions, and the thickness in the various types of the insulation films and the interlayer insulation films are used only for the purpose of description of the present invention. Consequently, depending on application fields and objects in use, it is possible to modify the above conditions of the processes and the thickness in the insulation films and the interlayer insulation films.

It is thus apparent that the present invention is not limited to the above embodiments but may be changed and modified without departing from the scope and spirit of the invention.

Finally, the present application claims the Convention Priority based on Japanese Patent Application No. Hei10-353565 filed on Dec. 11, 1998, which is herein incorporated by reference.

What is claimed is:

1. A Metal Insulator Semiconductor (MIS) type semiconductor device comprising:

a semiconductor substrate;

a high concentration drain region of a first conductive type selectively formed in a major surface of said semiconductor substrate;

a base region of a second conductive type selectively formed in said major surface of said semiconductor substrate so as to be separated from said high concentration drain region;

a source region comprising a plurality of regions of said first conductive type formed in said base region of said second conductive type; and an insulated-type gate electrode formed between said source region of said first conductive type and said high concentration drain region of said first conductive type, wherein said base region of said second conductive type has its outline formed into a polygonal-shaped configuration in plan view, wherein said plurality of regions of said source region of said first conductive type is offset by a predetermined distance from a center line through which, in plan view, a center of said high concentration drain region of said first conductive type is connected with a center of said base region of said second conductive type, wherein a corner portion of said polygonal-shaped configuration is disposed such that said center line goes through said corner portion thereof.

2. A semiconductor device according to claim 1, wherein a high concentration base region of said second conductive type is selectively formed in said base region of said second conductive type and said source region of said first conductive type is disposed adjacent to a peripheral portion of said high concentration base region of said second conductive type.

3. A Metal Insulator Semiconductor (MIS) type semiconductor device comprising:

a semiconductor substrate;

a high concentration drain region of a first conductive type selectively formed in a major surface of said semiconductor substrate;

a base region of a second conductive type selectively formed in said major surface of said semiconductor substrate so as to be separated from said high concentration drain region;

a source region comprising a plurality of regions of said first conductive type formed in said base region of said second conductive type; and an insulated-type gate electrode formed between said source region of said first conductive type and said high concentration drain region of said first conductive type, wherein said plurality of regions of said source region of said first conductive type is offset by a predetermined distance from a center line through which, in plan view, a center of said high concentration drain region of said first conductive type is connected with a center of said base region of said second conductive type, wherein said base region of said second conductive type is shaped as a polygonal-shaped configuration in plan view and said source region of said first conductive type is not disposed in any corner portions of said polygonal-shaped configuration.

4. A semiconductor device according to claim 1, wherein a plurality of said source regions each of said first conductive type and a plurality of said high concentration drain regions each of said first conductive type are provided.

5. A semiconductor device according to claim 2, wherein said base region of said second conductive type has its outline formed into a polygonal-shaped configuration in plan view, said source region of said first conductive type has its source portions not disposed on said center line, said source portions corresponding to corner portions of said polygonal-shaped configuration.

6. A Metal Insulator Semiconductor (MIS) type semiconductor device comprising:

a semiconductor substrate;

a high concentration drain region of a first conductive type selectively formed in a major surface of said semiconductor substrate;

a base region of a second conductive type selectively formed in said major surface of said semiconductor substrate so as to be separated from said high concentration drain region;

a source region comprising a plurality of regions of said first conductive type formed in said base region of said second conductive type; and an insulated-type gate electrode formed between said source region of said first conductive type and said high concentration drain region of said first conductive type, wherein said plurality of regions of said source region of said first conductive type is offset by a predetermined distance from a center line through which, in plan view, a center of said high concentration drain region of said first conductive type is connected with a center of said base region of said second conductive type, wherein a high concentration base region of said second conductive type is selectively formed in said base region of said second conductive type and said source region of said first conductive type is disposed adjacent to a peripheral portion of said high concentration base region of said second conductive type, wherein said base region of said second conductive type is shaped as a polygonal-shaped configuration in plan view and said source region of said first conductive type is not disposed in any corner portions of said polygonal-shaped configuration.

7. A semiconductor device according to claim 2, wherein a plurality of said source regions each of said first conductive type and a plurality of said high concentration drain regions each of said first conductive type are provided.

* * * * *